United States Patent [19]

Okamoto et al.

[11] Patent Number: 4,521,711
[45] Date of Patent: Jun. 4, 1985

[54] UNIDIRECTIONAL TRANSDUCER FOR A SURFACE-ACOUSTIC-WAVE DEVICE AND A METHOD OF MAKING SAME

[75] Inventors: Takeshi Okamoto; Shoichi Minagawa, both of Tokyo, Japan

[73] Assignee: Clarion Co., Ltd., Tokyo, Japan

[21] Appl. No.: 482,755

[22] Filed: Apr. 7, 1983

[30] Foreign Application Priority Data

Apr. 14, 1982 [JP] Japan ................................ 57-62001
Apr. 14, 1982 [JP] Japan ................................ 57-62002

[51] Int. Cl.³ .............................................. H03H 9/25
[52] U.S. Cl. .................................. 310/313 B; 333/151; 333/154; 333/194
[58] Field of Search ........... 310/313 R, 313 B, 313 D, 310/331, 332, 334, 366; 333/151, 154, 194, 195

[56] References Cited

U.S. PATENT DOCUMENTS

| | | | |
|---|---|---|---|
| 3,686,518 | 8/1972 | Hartmann et al. | 333/154 |
| 3,893,048 | 7/1975 | Lieberman | 310/334 |
| 4,267,533 | 5/1981 | Dempsey et al. | 310/313 B |
| 4,328,473 | 5/1982 | Montress et al. | 333/196 |
| 4,350,916 | 9/1982 | August et al. | 310/313 B |

FOREIGN PATENT DOCUMENTS 52-58342 5/1977 Japan ................................ 333/194

OTHER PUBLICATIONS

Shimizu et al., "Unidirectional SAW Transducers with ZnO Film on Glass Substrate", *Electronics Letters*, vol. 13, No. 13, Jun. 23, 1977.

*Primary Examiner*—Peter S. Wong
*Assistant Examiner*—D. L. Rebsch
*Attorney, Agent, or Firm*—Flynn, Thiel, Boutell & Tanis

[57] ABSTRACT

A surface-acoustic-wave device includes a transducer in which three transducer electrodes are provided on a non-piezoelectric or piezoelectric substrate with 0°, 120° and 240° phases, and one of the leading electrodes connected to one of the transducer electrodes extends along the surface of a piezoelectric layer provided on the substrate.

8 Claims, 7 Drawing Figures

UNIDIRECTIONAL TRANSDUCER FOR A SURFACE-ACOUSTIC-WAVE DEVICE AND A METHOD OF MAKING SAME

FIELD OF THE INVENTION

This invention relates to a surface-acoustic-wave device including a unidirectional transducer which realizes wide band characteristics.

BACKGROUND OF THE INVENTION

A surface acoustic wave travelling on the optically polished surface of an elastic substrate is superior in various ways to a bulk wave that was conventionally used, and is more and more used in a variety of electronic parts such as filters. FIG. 1 shows an example of a filter in which reference numeral 1 denotes a piezoelectric substrate, 2 refers to an input transducer comprising a pair of interdigital electrodes 3A and 3B, and 4 to an output transducer comprising a pair of interdigital electrodes 5A and 5B, respectively. A signal supplied through an input terminal IN is converted to a surface acoustic wave by the input transducer 2 and travels on the surface of the elastic substrate 1 in the arrow direction in the Figure. When the surface acoustic wave reaches the output transducer 4, it is converted to an electric signal and is taken out from an output terminal OUT.

The filter of FIG. 1, however, wherein two transducers 2 and 4 each including the pair of interdigital electrodes 3A and 3B or 5A and 5B are provided, cannot be free from electromechanical conversion loss because the transducers 2 and 4 operate to propagate surface acoustic waves in both right and left directions, respectively.

To alleviate the drawback, there was proposed a unidirectional transducer which propagates a surface acoustic wave in only one direction on the surface of a piezoelectric substrate. It is known to use in such a unidirectional transducer a 120° phase shifter or 90° phase shifter, as shown in FIG. 2, or otherwise a reflector as shown in FIG. 3.

In FIG. 2, reference numerals 6, 6A and 6B are electrodes with 120° phase difference relative to each other. The electrodes 6 and 6A are kept uncontacted by gaps 7 or insulative layers provided therebetween. Thereby, a surface acoustic wave travels in only one direction.

However, phase shifters which require specific provision at intersections of electrodes to prevent contact therebetween make manufacturing processes complicated.

In FIG. 3, reference numerals 8A and 8B are a power supply section and a reflecting section, both being of a normalized type and including interdigital electrodes.

Reference numeral 9 refers to a common electrode having portions 8A and 8B, 10 to a signal source, 11 to a matching circuit, and 12 to a reactance circuit, respectively. With this arrangement, a signal applied from the signal source 10 through the matching circuit 11 is converted to surface acoustic wave and travels in both the right and left directions from the power supply section 8A. The wave which traveled to the left is reflected and returned to the right by the reflecting section 8B to which the reactance circuit 12 is connected. The reflected wave is thereby synthesized in the power supply section 8A with the wave travelling to the right. In this case, when both waves are near the center frequency of the device, they substantially coincide in their phases. However, when both waves are far from the center frequency, they compensate or in other words partially cancel each other. As the result, the surface acoustic wave also travels in the contrary direction and the aimed unidirectional propagation cannot be attained. This means that the surface-acoustic-wave device is not suitable for wide band wave processing.

OBJECT OF THE INVENTION

It is therefore an object of the present invention to provide a surface-acoustic-wave device including a unidirectional transducer with wide band characteristics.

Another object of the present invention is to provide a surface-acoustic-wave device including a unidirectional transducer which can be manufactured at a lower production cost.

SUMMARY OF THE INVENTION

In accordance with the present invention, transducer electrodes are provided on a non-piezoelectric or piezoelectric substrate with 0°, 120° and 240° phases, a piezoelectric layer is provided so as to cover the transducer electrodes, and leading electrodes connected to the respective transducer electrodes are provided on the piezoelectric layer, thereby constructing a unidirectional transducer.

DETAILED DESCRIPTION OF THE PREFERRED EMBODIMENTS

Figure 1:
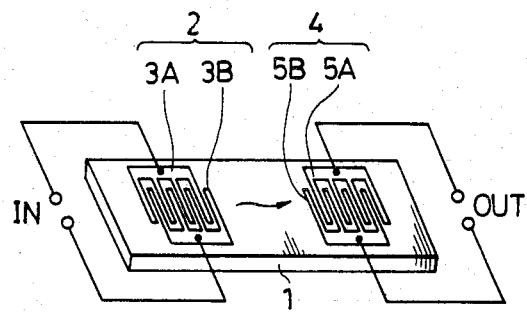
FIGS. 1 to 3 are schematic views showing conventional surface-acoustic-wave devices.
Figure 2:
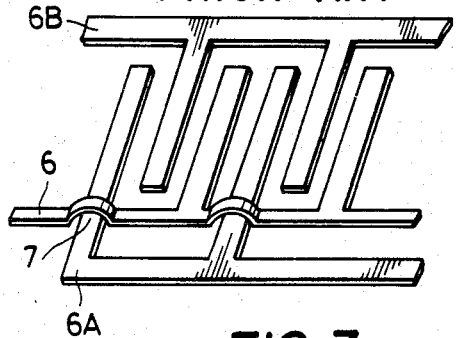
Figure 3:
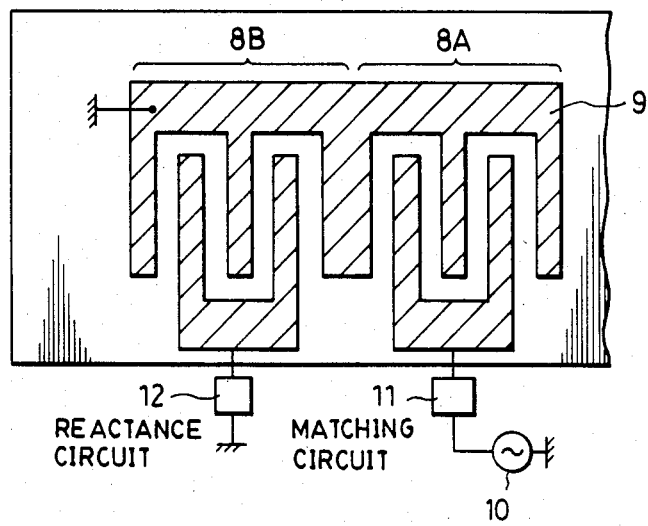
Figure 4:
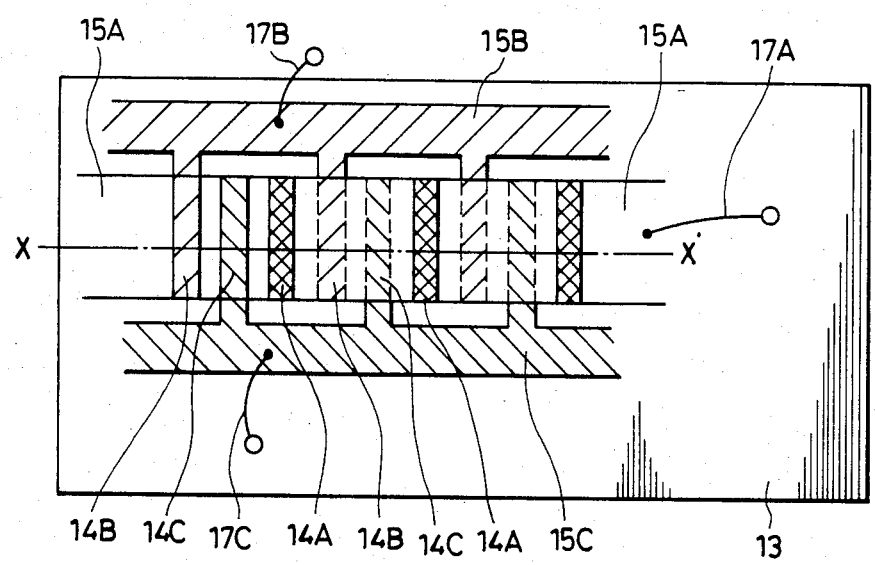
FIG. 4 is a schematic top view illustrating an embodiment according to the present invention.
Figure 5:
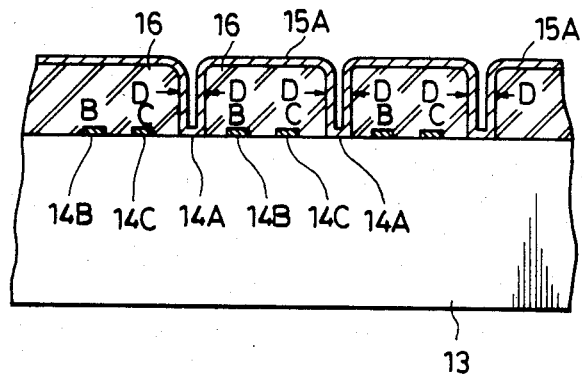
FIG. 5 is a schematic sectional view taken along the line X—X'.

FIGS. 4 and 5 are schematic top and sectional views illustrating an embodiment of the surface-acoustic-wave device according to the present invention. Electrodes 14A, 14B and 14C are provided on the surface of a non-piezoelectric substrate 13 made of silicon, etc. with 0°, 120° and 240° phases. In other words, these electrodes are spaced by a distance of one-third of one wavelength of the center frequency of the device. To the respective electrodes 14B and 14C of said three-phase electrodes are connected lead or leading electrodes 15B and 15C, respectively, which are provided on the surface of the non-piezoelectric substrate 13. A piezoelectric layer 16 of zinc oxide, etc. is provided on the surface of the non-piezoelectric substrate 13 so as to cover the electrodes 14B and 14C. A leading electrode 15A provided along the surface of the piezoelectric layer 16 is connected to lock electrode 14A. Power supply terminals 17A, 17B and 17C are connected to the leading electrodes 15A, 15B and 15C, respectively, by wire bonding or other methods to supply respective phase signals.

Said device is made by the following method, for example. First, appropriate metal is deposited throughout the surface of the non-piezoelectric substrate 13 by vacuum vapor deposition or other methods. Next, the metal is partially removed by photo etching except patterns for the electrodes 14B and 14C of the three-phase electrodes as well as the leading electrodes 15B and 15C. The piezoelectric layer 16 is thereafter deposited throughout the surfaces of the non-piezoelectric substrate 13 and the electrodes 14B, 14C, 15B and 15C. The piezoelectric layer 16 is provided with windows between respective adjacent pairs of electrodes 14B and 14C in order to provide the lead electrodes 14A on the non-piezoelectric substrate 13 with a uniform width D. The surface of the piezoelectric layer 16 and the exposed parts of the non-piezoelectric substrate 13 are covered by a metallic film so that the electrode 14A and the leading electrode 15A are made on the non-piezoelectric substrate 13 and along the surface of the piezoelectric layer 16, respectively.

Finally the power supply terminals 17A, 17B and 17C are made by connecting metal wires to the leading electrodes 15A, 15B and 15C, and as the result, the device of FIG. 4 is finished.

With this arrangement, when three-phase electric signals are applied to the three-phase electrodes 14A, 14B and 14C of the transducer, respectively, through the power supply terminals 17A, 17B and 17C, the transducer can operate as a unidirectional transducer over a wide frequency band.

If silicon is used as the non-piezoelectric substrate 13 and zinc oxide is used as the piezoelectric layer 16, the surface-acoustic-wave device may be made together with semiconductive devices on one common substrate. Even if the silicon substrate is previously provided with a zinc oxide layer thereon, the same effect can be obtained.

Figure 6:
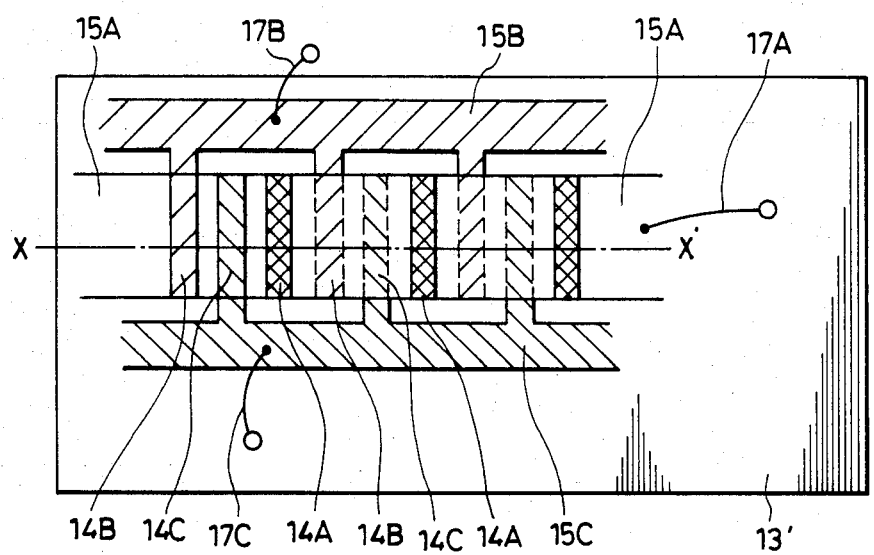
FIG. 6 is a schematic top view illustrating a further embodiment according to the present invention.
Figure 7:
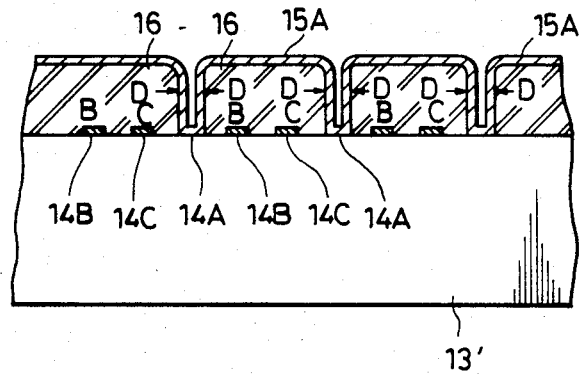
FIG. 7 is a schematic sectional view taken along the line X—X'.

FIGS. 6 and 7 show a further embodiment according to the present invention wherein the substrate 13' is made of a piezoelectric material such as lithium niobate. The other parts of the device are the same as those of FIGS. 4 and 5; the manufacturing method will be easily understood from the foregoing description.

In this embodiment, when lithium niobate (LiNbO$_3$) is used as the elastic substrate 13' with the piezoelectric layer of zinc oxide (ZnO) deposited thereon, the electromechanical coupling coefficient of the unidirectional transducer is enlarged as compared to a device wherein a non-laminated lithium niobate substrate is used. This permits reduction of pairs of electrodes which comprise the transducer, resulting in increase of efficiency of the device and in realization of wider band characteristics.

As described in the above, the unidirectional transducer in the present invention is made so that one of the three leading electrodes to be connected to one of the three electrodes provided on the non-piezoelectric substrate with 0°, 120° and 240° phases extends along the surface of the piezoelectric layer, whereby a wide band characteristic can be effected. Further, as to manufacturing method, the three-phase signal electrodes can be easily made by use of conventional methods, so the manufacturing cost can be reduced.

It should be noted that the manufacturing method introduced in the specification is one example, and therefore the method may be modified or other processes may be added as desired.

The embodiments of the invention in which an exclusive property or privilege is claimed are defined as follows:

1. A unidirectional transducer for a surface-acoustic-wave device, comprising: a substrate having a surface thereon; a plurality of first electrodes provided on said surface of said substrate at locations which are spaced from each other in a direction by a first predetermined distance; a plurality of second electrodes provided on said surface of said substrate, each said second electrode being spaced in said direction from a respective said first electrode by a second predetermined distance which is substantially one-third of said first predetermined distance; a plurality of third electrodes provided on said surface of said substrate, each said third electrode being spaced in said direction from a respective said second electrode by said second predetermined distance; first and second lead electrodes provided on said surface of said substrate, said first lead electrode being electrically connected to each of said first electrodes and said second lead electrode being electrically connected to each of said second electrodes; a layer of piezoelectric material provided on said surface of said substrate and covering each of said first and second electrodes, said piezoelectric layer having means defining a window therethrough in the region of each said third electrode; and a third lead electrode provided on said piezoelectric layer, said third lead electrode being electrically connected to each said third electrode through the associated window in said piezoelectric layer.

2. The unidirectional transducer according to claim 1, wherein said substrate is a piezoelectric material.

3. The unidirectional transducer according to claim 2, wherein said substrate is made of lithium niobate and said piezoelectric layer is made of zinc oxide.

4. The unidirectional transducer according to claim 1, wherein said substrate is a non-piezoelectric material.

5. The unidirectional transducer according to claim 4, wherein said substrate is made of silicon and said piezoelectric layer is made of zinc oxide.

6. The unidirectional transducer according to claim 1, wherein said first predetermined distance is substantially equal to one wavelength of a center frequency of the surface-acoustic-wave device.

7. The unidirectional transducer according to claim 1, wherein each said third electrode is an integral portion of said third lead electrode.

8. The unidirectional transducer according to claim 1, wherein each of said first, second and third electrodes has a width in said direction which is a predetermined dimension.

* * * * *